(12) United States Patent
Watanabe et al.

(10) Patent No.: US 8,673,786 B2
(45) Date of Patent: Mar. 18, 2014

(54) METHOD FOR MANUFACTURING MICROSTRUCTURE USING SELF-ASSEMBLY OF AMPHIPHILIC POLYMER

(75) Inventors: Kei Watanabe, Tokyo (JP); Ichiro Mizushima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,811

(22) Filed: Mar. 20, 2012

(65) Prior Publication Data
US 2013/0084704 A1    Apr. 4, 2013

(30) Foreign Application Priority Data

Sep. 30, 2011    (JP) ................................. 2011-216656

(51) Int. Cl.
*H01L 21/311*    (2006.01)

(52) U.S. Cl.
USPC .................................. 438/703; 257/E21.257

(58) Field of Classification Search
USPC .................................. 438/703; 257/E21.257
See application file for complete search history.

(56) References Cited

U.S. PATENT DOCUMENTS

| | | | |
|---|---|---|---|
| 2005/0136685 A1 * | 6/2005 | Takenaka et al. | 438/778 |
| 2008/0041818 A1 * | 2/2008 | Kihara et al. | 216/41 |
| 2009/0078673 A1 * | 3/2009 | Kihara et al. | 216/11 |
| 2010/0173498 A1 * | 7/2010 | Abatchev et al. | 438/704 |
| 2011/0186544 A1 | 8/2011 | Endou et al. | |
| 2011/0237052 A1 | 9/2011 | Mizushima et al. | |

FOREIGN PATENT DOCUMENTS

| | | |
|---|---|---|
| JP | 2007-301839 | 11/2007 |
| JP | 2007301839 | * 11/2007 |
| JP | 2010-115832 | 5/2010 |

OTHER PUBLICATIONS

Notification of Comments issued by the Korean Patent Office on Apr. 8, 2013, for Korean Patent Application No. 10-2012-27084, and English-language translation thereof.

* cited by examiner

*Primary Examiner* — Kimberly Rizkallah
*Assistant Examiner* — Duy T Nguyen
(74) *Attorney, Agent, or Firm* — Finnegan, Henderson, Farabow, Garrett & Dunner, L.L.P.

(57) ABSTRACT

According to one embodiment, a method for manufacturing a microstructure includes forming a guide film on a patterning material, forming a cured film, forming a mask member, and performing processing of the patterning material using the mask member as a mask. An opening is made in the guide film. An upper surface of the guide film is hydrophilic, a side surface of the opening is hydrophobic. The forming the cured film includes applying a solution to cover the patterning material and the guide film, separating the solution into a hydrophobic block and a hydrophilic block, and curing the solution. The solution contains an amphiphilic polymer having a hydrophobic portion and a hydrophilic portion. A length of the hydrophobic portion is longer than a length of the hydrophilic portion. The mask member is formed by removing the hydrophilic block from the cured film.

13 Claims, 6 Drawing Sheets

METHOD FOR MANUFACTURING MICROSTRUCTURE USING SELF-ASSEMBLY OF AMPHIPHILIC POLYMER

CROSS-REFERENCE TO RELATED APPLICATIONS

This application is based upon and claims the benefit of priority from the prior Japanese Patent Application No. 2011-216656, filed on Sep. 30, 2011; the entire contents of which are incorporated herein by reference.

FIELD

Embodiments described herein relate generally to a method for manufacturing a microstructure.

BACKGROUND

Bit densities of conventional memory devices such as nonvolatile memory, etc., have been increasing year by year. Bit densities still continue to increase; and terabit-level bit densities are necessary. Fine memory cells having sizes not more than 20 to 30 nm are necessary to achieve such a high bit density. While it is necessary to introduce a new exposure apparatus or employ a new integration method such as double patterning, etc., to form such a fine pattern, in any case, the costs undesirably increase.

To solve this problem, technology that utilizes the self-assembly of an amphiphilic polymer has been proposed. In such technology, a solution that includes the amphiphilic polymer is phase-separated into two blocks; and a fine pattern is subsequently formed by removing one of the blocks. However, in such technology, it is difficult to control the arrangement position and the configuration of the blocks with high precision.

DETAILED DESCRIPTION

In general, according to one embodiment, a method for manufacturing a microstructure includes forming a guide film on a patterning material, forming a cured film, forming a mask member, and performing processing of the patterning material using the mask member as a mask. In the forming a guide film, an opening is made in the guide film. An upper surface of the guide film is hydrophilic, a side surface of the opening is hydrophobic. The forming the cured film includes applying a solution to cover the patterning material and the guide film, separating the solution into a hydrophobic block and a hydrophilic block, and curing the solution. The solution contains an amphiphilic polymer having a hydrophobic portion and a hydrophilic portion. A length of the hydrophobic portion is longer than a length of the hydrophilic portion. The hydrophobic portion is aggregated in the hydrophobic block. The hydrophilic portion is aggregated in the hydrophilic block. The mask member is formed by removing the hydrophilic block from the cured film.

In general, according to other embodiment, a method for manufacturing a microstructure includes forming a guide film on a patterning material, forming a cured film, forming a mask member, and performing processing of the patterning material using the mask member as a mask. In the forming a guide film, an opening is made in the guide film. An upper surface of the guide film is hydrophobic, a side surface of the opening is hydrophilic. The forming the cured film includes applying a solution to cover the patterning material and the guide film, separating the solution into a hydrophobic block and a hydrophilic block, and curing the solution. The solution contains an amphiphilic polymer having a hydrophobic portion and a hydrophilic portion. A length of the hydrophilic portion is longer than a length of the hydrophobic portion. The hydrophobic portion is aggregated in the hydrophobic block. The hydrophilic portion is aggregated in the hydrophilic block. The mask member is formed by removing the hydrophobic block from the cured film.

Embodiments of the invention will now be described with reference to the drawings.

A first embodiment will now be described.

The embodiment is a method for manufacturing a microstructure by forming a mask member having a fine pattern on a patterning material by DSA (Directed Self-Assembly) technology using the orientation characteristics of an amphiphilic polymer (Block Co-Polymer (BCP)) and by performing processing of the patterning material using the mask member as a mask. Thereby, for example, fine trenches that are periodically arranged can be made in the upper surface of a silicon substrate.

FIGS. 1A to 1D and FIGS. 2A to 2D are cross-sectional views of processes, illustrating the method for manufacturing the microstructure according to the embodiment.

Figure 3A:
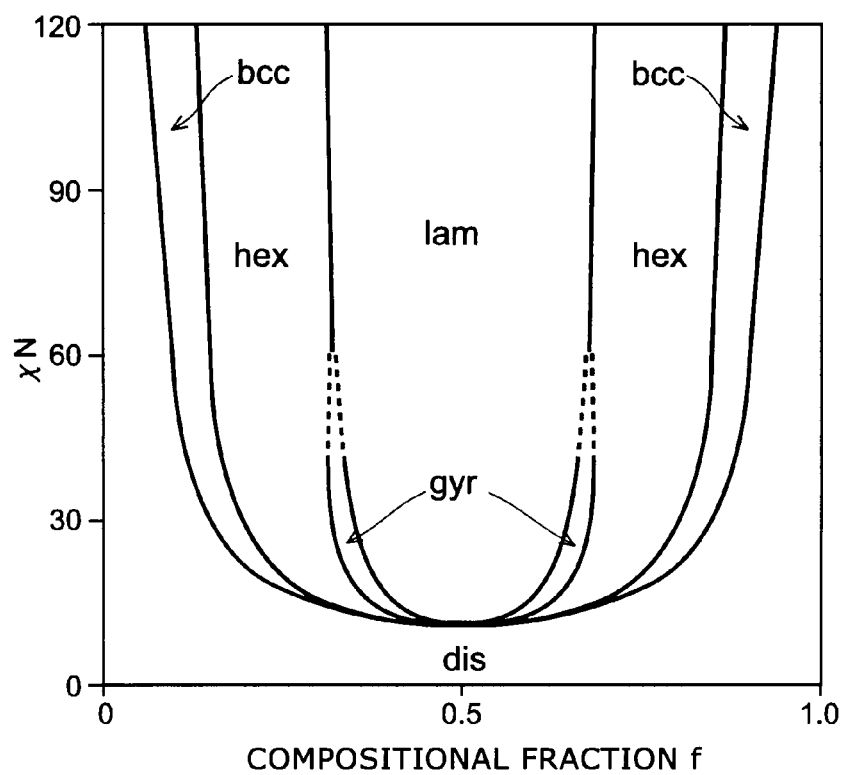
FIG. 3A is a graph illustrating the correlation between the composition of an amphiphilic polymer and forms of phase separation.
Figure 3B:
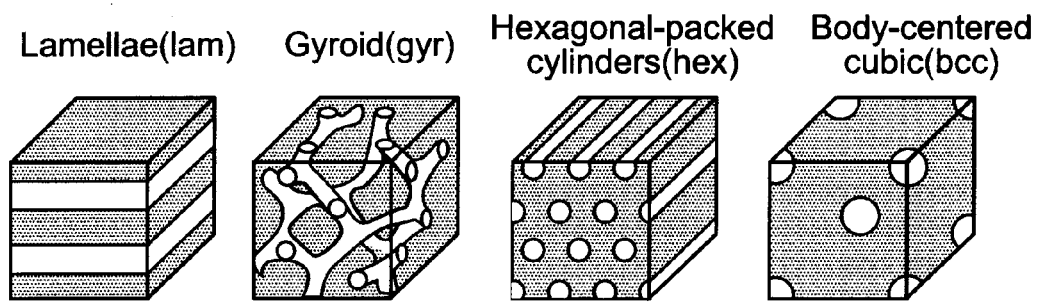
FIG. 3B is a schematic view illustrating the forms of the phase separation illustrated in FIG. 3A.

FIG. 3A is a graph illustrating the correlation between the composition of the amphiphilic polymer and the forms of the phase separation, where the horizontal axis illustrates the compositional fraction f of the two polymer chains included in the amphiphilic polymer, and the vertical axis illustrates the value of $\chi N$. FIG. 3B is a schematic view illustrating the forms of the phase separation illustrated in FIG. 3A.

In the vertical axis of FIG. 3A, $\chi$ is the Flory-Huggins segment-segment interaction parameter and is a value determined by the polymer components; and N is the degree of polymerization of the entire amphiphilic polymer.

Figure 1A:
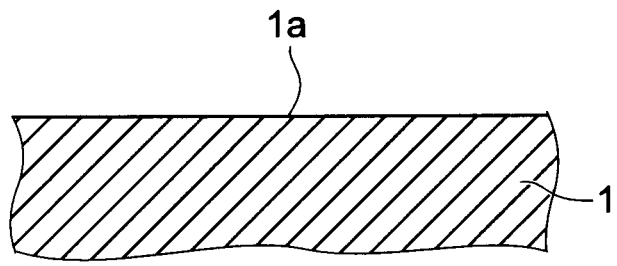
FIGS. 1A to 1D and FIGS. 2A to 2D are cross-sectional views of processes, illustrating a method for manufacturing a microstructure according to a first embodiment.

First, as illustrated in FIG. 1A, a patterning material 1 is prepared. For example, the patterning material 1 may be a semiconductor substrate, an insulating film formed on a semiconductor substrate, or a conductive film formed on a semiconductor substrate. In the embodiment, an upper surface is of the patterning material 1 is hydrophobic. For example, in the case where the patterning material 1 is a silicon substrate, the upper surface 1a becomes hydrophobic if the native oxide film is sufficiently thin.

Figure 1B:
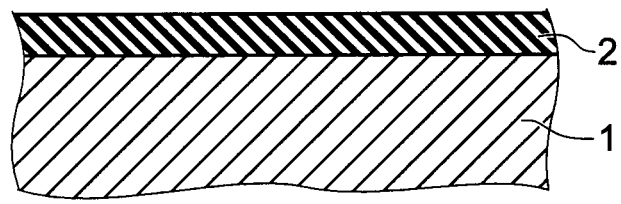

Then, as illustrated in FIG. 1B, a hydrophobic base film 2 is uniformly formed on the patterning material 1 by CVD (Chemical Vapor Deposition) or coating. An organic material film, an amorphous carbon film, and the like are examples of the hydrophobic base film 2. In the process illustrated in FIG. 2A described below, the film thickness of the base film 2 is a thickness such that the solution including the amphiphilic polymer can be phase-separated into a cylindrical configuration.

Figure 1C:
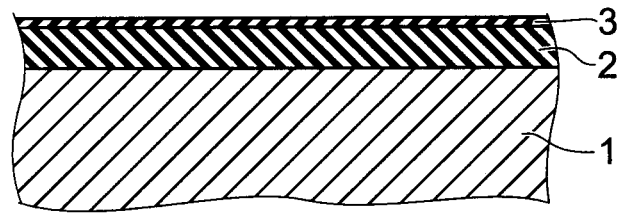

Then, as illustrated in FIG. 1C, a hydrophilic cover film 3 is uniformly formed on the base film 2 by CVD or coating. A silicon oxide film, a silicon nitride film, and the like are examples of the hydrophilic cover film 3. The cover film 3 is formed to be thinner than the base film 2.

Figure 1D:
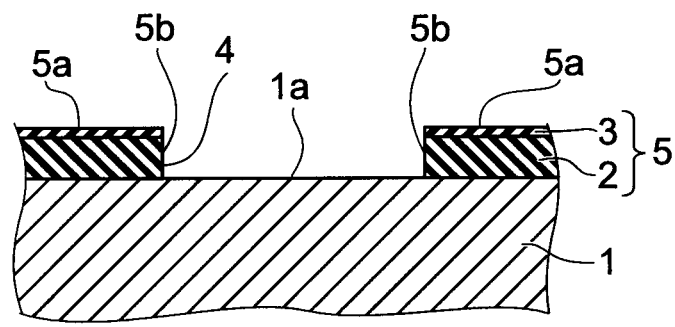

Then, as illustrated in FIG. 1D, the cover film 3 and the base film 2 are selectively removed by lithography and reactive ion etching. Thereby, an opening 4 is made in the cover film 3 and the base film 2 in the region where the processing of the patterning material 1 is to be performed. Thus, a guide film 5 made of the base film 2 and the cover film 3 is formed; and the opening 4 is made in the guide film 5. An upper surface 5a of the guide film 5 is hydrophilic because the hydrophilic cover film 3 is exposed at the upper surface 5a. A side surface 5b of the opening 4 of the guide film 5 is hydrophobic because the hydrophobic base film 2 is exposed at the side surface 5b. Thus, the surface energy is different between the upper surface 5a and the side surface 5b of the guide film 5 because the materials that are exposed at the surfaces are different.

Figure 2A:
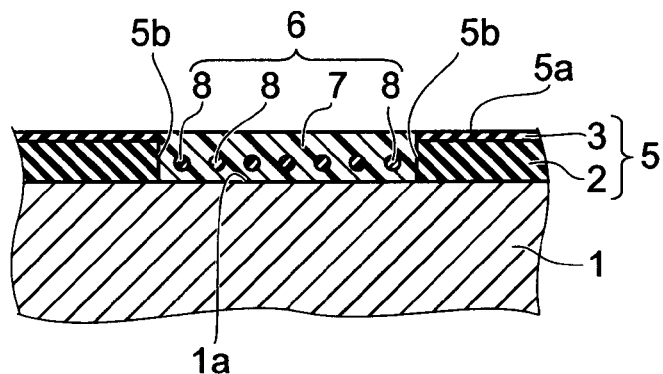

Continuing as illustrated in FIG. 2A, a solution 6 is coated onto the patterning material 1 and the guide film 5. The solution 6 is a solution containing an amphiphilic polymer (a BCP). The amphiphilic polymer is a molecule that includes both a hydrophobic portion and a hydrophilic portion and is, for example, a molecule having one straight chain with a hydrophobic group bonded on one side and a hydrophilic group bonded on the other side.

Polystyrene-polymethylmethacrylate (PS-PMMA), polystyrene-poly(ethylene-alt-propylene) (PS-PEP), polystyrene-polybutadiene (PS-PBD), polystyrene-polyisoprene (PS-PI), polystyrene-polyvinyl methyl ether (PS-PVME), polystyrene-polyethylene oxide (PS-PEO), and the like are examples of the amphiphilic polymer. In other words, the hydrophobic portion of the amphiphilic polymer is, for example, polystyrene. The hydrophilic portion is, for example, one type of molecule selected from the group consisting of polymethylmethacrylate, poly(ethylene-alt-propylene), polybutadiene, polyisoprene, polyvinyl methyl ether, and polyethylene oxide. The solvent may include, for example, an organic solvent such as diglyme, etc.

As illustrated in FIGS. 3A and 3B, in the case where the compositional fraction of the lesser portion of the hydrophobic portion and the hydrophilic portion of the amphiphilic polymer is about 0.15 to 0.35, the structure after the phase separation is a hex (Hexagonal packed cylinders) structure. In other words, when the amphiphilic polymer is phase-separated, a block is formed in a cylindrical configuration by aggregation of the lesser portion of the hydrophobic portion and the hydrophilic portion of the amphiphilic polymer. The greater portion forms a block to fill around the block having the cylindrical configuration. In the case where the solution 6 contains a component other than the amphiphilic polymer, it is favorable to adjust the content such that the volumes of the blocks after the phase separation have the proportion described above.

In the embodiment, the amphiphilic polymer included in the solution 6 is a molecule in which the length of the hydrophobic portion is longer than the length of the hydrophilic portion. Specifically, the compositional fraction of the hydrophilic portion in the entire amphiphilic polymer is about 0.15 to 0.35. For example, the compositional fraction of the hydrophilic portion to the hydrophobic portion is 7:3. Thereby, the solution 6 is separated into a hydrophobic block 7 in which the hydrophobic portions of the amphiphilic polymer are aggregated and a hydrophilic block 8 in which the hydrophilic portions of the amphiphilic polymer are aggregated. At this time, the hydrophilic block 8 has a cylindrical configuration extending in a direction parallel to the upper surface 1a of the patterning material 1. The side surface 5b of the opening 4 of the guide film 5 becomes a physical guide; and multiple hydrophilic blocks 8 are arranged periodically and mutually parallel inside the opening 4. On the other hand, the hydrophobic block 7 has a configuration around the hydrophilic block 8. Hereinbelow, the block having a cylindrical configuration is also called the cylinder block; and the block provided around the cylinder block is also called the peripheral block.

Because the upper surface 1a of the patterning material 1 and the side surface 5b of the opening 4 of the guide film 5 are hydrophobic, the hydrophobic block 7 has high affinity (wettability) with the upper surface 1a and the side surface 5b and low affinity (wettability) with the upper surface 5a of the guide film 5. Thereby, the solution 6 is filled only into the interior of the opening 4 and does not remain on the upper surface 5a of the guide film 5.

At this time, the arrangement period of the cylinder block (the hydrophilic block 8) can be controlled by selecting the total molecular weight, i.e., the molecular chain length, of the amphiphilic polymer. The ratio of the diameter of the cylinder block to the arrangement period of the cylinder block can be controlled by selecting the compositional fractions of the hydrophobic portion and the hydrophilic portion of the amphiphilic polymer. Further, n cylinder blocks can be arranged along one direction inside the opening 4 by the length of the opening 4 in the one direction being n times twice the length of the molecular chain length of the amphiphilic polymer (where n is an integer). On the other hand, as the length of the opening 4 in the one direction shifts from being an integer multiple of twice the length of the molecular chain length of the amphiphilic polymer, the cylinder block is no longer arranged well along the one direction. Thus, the direction of the cylinder block can be controlled by selecting the dimension of the opening 4. The configuration of the cylinder block can be controlled by controlling the polarities of the hydrophobic portion and the hydrophilic portion of the amphiphilic polymer. Therefore, the arrangement period can be controlled by controlling the diameter of the cylinder block by adjusting the difference between the polarities of the two portions.

Figure 2B:
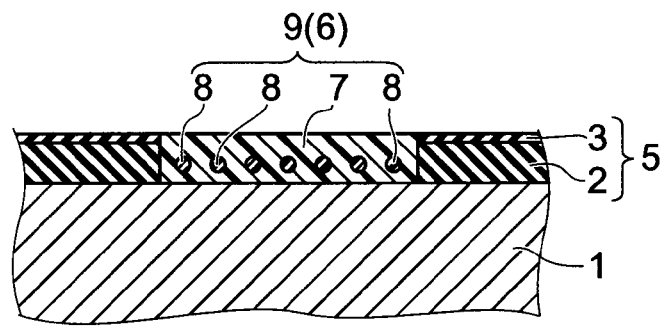

Then, as illustrated in FIG. 2B, the solvent inside the solution 6 is caused to volatilize by heating. Thereby, the solution 6 is cured to form a cured film 9.

Figure 2C:
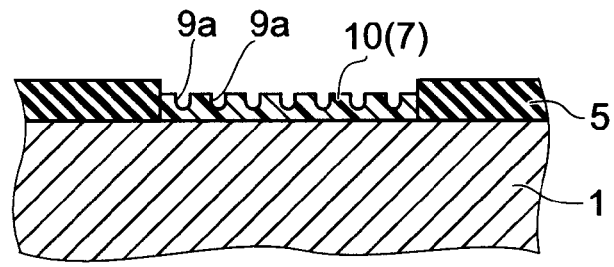

Continuing as illustrated in FIG. 2C, etching such as, for example, reactive ion etching (RIE), etc., is performed on the cured film 9 with conditions such that the etching rate of the cylinder block (the hydrophilic block 8) is faster than the etching rate of the peripheral block (the hydrophobic block 7). Thereby, the cylinder block (the hydrophilic block 8) is removed from the cured film 9. At this time, the greater part of the peripheral block (the hydrophobic block 7) remains. As a result, the portion of the cured film 9 where the hydrophilic block 8 is removed becomes a recess 9a; and an unevenness pattern corresponding to the arrangement pattern of the hydrophilic block 8 is formed in the cured film 9. Thereby, a mask member 10 which is made of the remaining portion of the hydrophobic block 7 is formed.

Figure 2D:
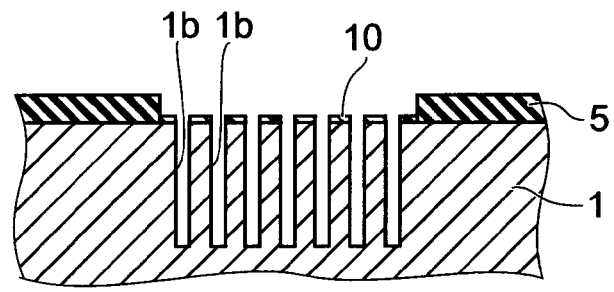

Then, as illustrated in FIG. 2D, processing of the patterning material 1 is performed using the mask member 10 as a mask. For example, multiple trenches 1b which are periodically arranged in the patterning material 1 are made by performing reactive ion etching using the mask member 10 as a mask. Thus, the microstructure is manufactured.

Effects of the embodiment will now be described.

In the embodiment, the solution 6 is filled only into the interior of the opening 4 and is not disposed on the upper surface 5a of the guide film 5 because the upper surface 5a of the guide film 5 is hydrophilic, the side surface 5b is hydrophobic, and the solution 6 that is coated has phase separation in which the hydrophobic block 7 is provided around the hydrophilic block 8 having the cylindrical configuration. Thereby, the arrangement of the hydrophilic block 8 is not disorderly even at the end portions of the opening 4; and the hydrophilic block 8 can be periodically arranged. As a result, the mask member 10 can be formed with high form accuracy; and the patterning material 1 can be patterned with high precision.

In the embodiment, the affinity between the solution 6 and the upper surface 1a is high and the solution 6 stably wets over the upper surface 1a because the solution 6 described above is used for the patterning material 1 for which the upper surface 1a is hydrophobic. Thereby, the mask member 10 can be formed with high precision.

In the embodiment, the guide film 5 is formed by forming the hydrophobic base film 2 on the patterning material 1, forming the hydrophilic cover film 3 on the base film 2, and making the opening 4 in the cover film 3 and the base film 2. Thereby, the guide film 5 that has different surface energies between the upper surface 5a and the side surface 5b can be formed by normal semiconductor processes.

A comparative example of the embodiment will now be described.

Figure 4:
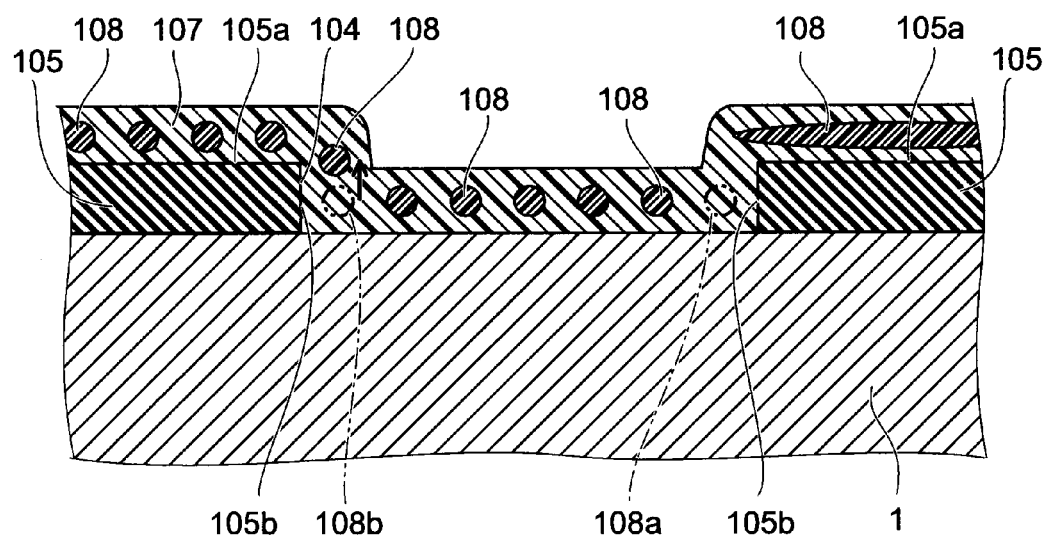
FIG. 4 is a cross-sectional view of a process, illustrating a method for manufacturing a microstructure according to a comparative example.

FIG. 4 is a cross-sectional view of a process, illustrating a method for manufacturing a microstructure according to this comparative example.

In this comparative example as illustrated in FIG. 4, a guide film 105 is formed on the patterning material 1. An opening 104 is made in the guide film 105. The structure of the guide film 105 is a monolayer structure; and the surface energy of an upper surface 105a is equal to the surface energy of a side surface 105b of the opening 104. The solution 6 described above is coated onto the guide film 105. At this time, the solution 6 is disposed not only in the interior of the opening 104 but also on the upper surface 105a because the surface energies are equal between the upper surface 105a and the side surface 105b of the guide film 105.

In the interior of the opening 104, the side surface 105b of the guide film 105 acts as a physical guide. However, on the upper surface 105a of the guide film 105, the formation position and the direction in which a cylinder block 108 extends are uncontrolled and are random because the physical guide does not exist. Therefore, the cylinder block 108 disposed at the end portion inside the opening 104 is affected by the cylinder block 108 disposed on the upper surface 105a. For example, the cylinder block 108 inside a peripheral block 107 is no longer formed at a position 108a where the cylinder block 108 normally would be formed. This causes a pattern defect to occur and becomes, for example, an open defect. Also, the cylinder block 108 shifts upward from a normal position 108b. This causes fluctuation of the dimensions when the pattern of the mask member is transferred onto the patterning material. Thus, in this comparative example, the cylinder block 108 cannot be arranged with high precision even inside the opening 104. As a result, the mask member cannot be formed with high precision; and the patterning material 1 cannot be patterned with high precision.

A modification of the embodiment will now be described.

This modification is an example that differs from the first embodiment described above in that the hydrophobic property and the hydrophilic property are reversed.

This modification will now be described with reference to FIGS. 1A to 1D and FIGS. 2A to 2D.

In this modification, the upper surface 1a of the patterning material 1 illustrated in FIG. 1A is hydrophilic. In such a case, in the process illustrated in FIG. 1B, the base film 2 is hydrophilic; and in the process illustrated in FIG. 1C, the cover film 3 is hydrophobic. Thereby, in the process illustrated in FIG. 1D, the guide film 5 in which the upper surface 5a is hydrophobic and the side surface 5b is hydrophilic is formed by forming the opening 4.

Then, as illustrated in FIG. 2A, the solution 6 is coated. In the amphiphilic polymer contained in the solution 6, the length of the hydrophilic portion is longer than the length of the hydrophobic portion. Thereby, opposite to the first embodiment, the hydrophobic block becomes the cylinder block and the hydrophilic block becomes the peripheral block. The solution 6 is disposed only inside the opening 4 without being disposed on the upper surface 5a because the upper surface is of the patterning material 1 and the side surface 5b of the guide film 5 are hydrophilic and the upper surface 5a of the guide film 5 is hydrophobic.

Continuing as illustrated in FIG. 2B, the cured film 9 is formed by causing the solution 6 to cure; and the mask member 10 is formed by removing the cylinder block (the hydrophobic block) by a process similar to the process illustrated in FIG. 2C. Then, as illustrated in FIG. 2D, processing of the patterning material 1 is performed using the mask member 10 as a mask.

According to this modification, the solution 6 can be more reliably filled into the opening 4 in the case where the upper surface is of the patterning material 1 is hydrophilic. Otherwise, the manufacturing method and the effects of this modification are similar to those of the first embodiment described above.

This modification may be applied in the case where the upper surface is of the patterning material 1 is hydrophobic; and the first embodiment may be applied in the case where the upper surface is 1a is hydrophilic. In either case, constant effects can be obtained. In other words, if at least the side surface of the opening is hydrophobic and the upper surface of the guide film is hydrophilic, the solution in which the peripheral block is hydrophobic is held inside the opening. Similarly, if at least the side surface of the opening is hydrophilic and the upper surface of the guide film is hydrophobic, the solution in which the peripheral block is hydrophilic is held inside the opening.

However, to more reliably hold the solution inside the opening, it is favorable for the properties of the bottom surface of the opening, i.e., the upper surface of the patterning material, to be the same as the properties of the side surface of the opening and the peripheral block of the solution. Specifically, in the case where the upper surface of the patterning material is hydrophobic as in the first embodiment described above, it is favorable for both the side surface of the opening and the peripheral block of the solution to be hydrophobic and the upper surface of the guide film to be hydrophilic. In the case where the upper surface of the patterning material is hydrophilic as in the modification described above, it is favorable for both the side surface of the opening and the peripheral block of the solution to be hydrophilic and the upper surface of the guide film to be hydrophobic.

A second embodiment will now be described.

Figure 5A:
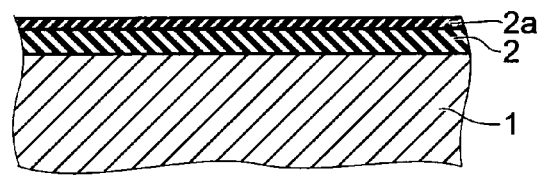
FIGS. 5A and 5B are cross-sectional views of processes, illustrating a method for manufacturing a microstructure according to a second embodiment.
Figure 5B:
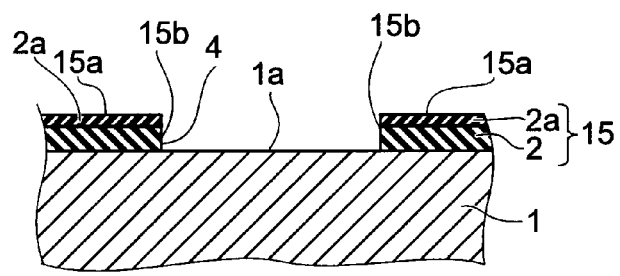

FIGS. 5A and 5B are cross-sectional views of processes, illustrating a method for manufacturing a microstructure according to the embodiment.

In the embodiment, the method for forming the guide film differs from that of the first embodiment described above.

First, similarly to the first embodiment described above, the patterning material 1 illustrated in FIG. 1A is prepared. The upper surface is of the patterning material 1 is hydrophobic.

Then, as illustrated in FIG. 1B, the hydrophobic base film 2 is uniformly formed on the patterning material 1 by CVD or coating. For example, the hydrophobic base film 2 is a silicon oxide film containing an organic material film, an amorphous carbon film, or an organic group.

Continuing as illustrated in FIG. 5A, a hydrophilic modified layer 2a is formed by performing modification treatment of the upper surface of the base film 2. For example, electron beam or ultraviolet irradiation or plasma irradiation of an oxidative gas such as an oxygen gas, etc., a reducing gas, or an inert gas are examples of such a modification treatment.

Then, as illustrated in FIG. 5B, a guide film 15 is formed by making the opening 4 in the base film 2. The thickness of the modified layer 2a described above is a thickness such that the upper surface of the base film 2 becomes hydrophilic and a side surface 15b of the opening 4 remains hydrophobic. Thereby, the guide film 15 is formed in which an upper surface 15a is hydrophilic and the side surface 15b is hydrophobic. The subsequent processes are similar to the processes illustrated in FIGS. 2A to 2D described in the first embodiment described above.

According to the embodiment, the guide film 15 in which the upper surface 15a is hydrophilic and the side surface 15b is hydrophobic can be formed by an easy modification treatment. Otherwise, the manufacturing method and the effects of the embodiment are similar to those of the first embodiment described above.

A third embodiment will now be described.

FIGS. 6A to 6D and FIGS. 7A to 7D are cross-sectional views of processes, illustrating a method for manufacturing a microstructure according to the embodiment.

In the embodiment, the method for forming the guide film differs from that of the first embodiment described above.

Figure 6A:
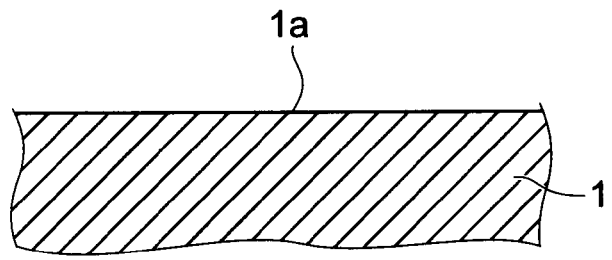
FIGS. 6A to 6D and FIGS. 7A to 7D are cross-sectional views of processes, illustrating a method for manufacturing a microstructure according to a third embodiment.

First, as illustrated in FIG. 6A, the patterning material 1 is prepared. Similarly to the first embodiment described above, the upper surface 1a of the patterning material 1 is hydrophobic.

Figure 6B:
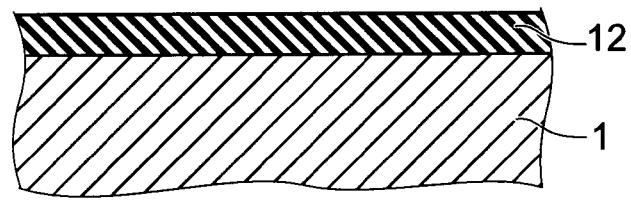

Then, as illustrated in FIG. 6B, a base film 12 is uniformly formed on the patterning material 1 by CVD or coating. At this time, the base film 12 differs from those of the first and second embodiments described above in that the base film 12 is hydrophilic. A silicon oxide film, a silicon nitride film, and the like are examples of the hydrophilic base film 12. The film thickness of the base film 12 is a thickness such that the solution including the amphiphilic polymer can be phase-separated into a cylindrical configuration in the process illustrated in FIG. 7B described below.

Figure 6C:
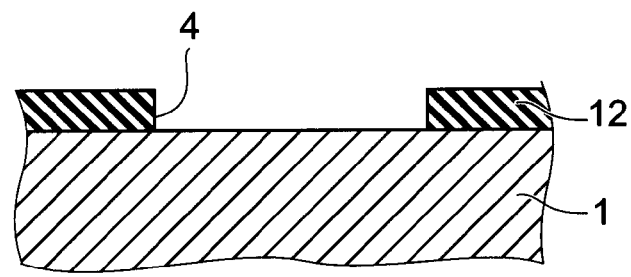

Continuing as illustrated in FIG. 6C, the opening 4 is made by patterning the base film 12 by lithography and reactive ion etching.

Figure 6D:
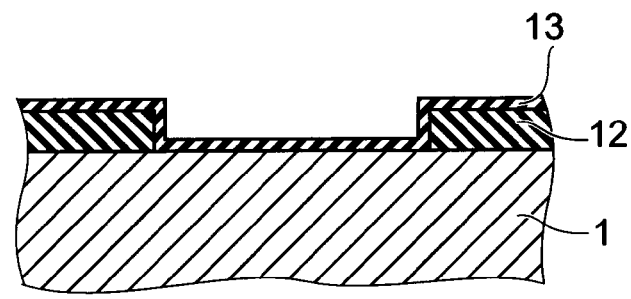

Then, as illustrated in FIG. 6D, a cover film 13 is uniformly formed by CVD or coating. At this time, the cover film 13 differs from those of the first and second embodiments described above in that the cover film 13 is hydrophobic. An organic material film, an amorphous carbon film, and the like are examples of the hydrophobic cover film 13.

Figure 7A:
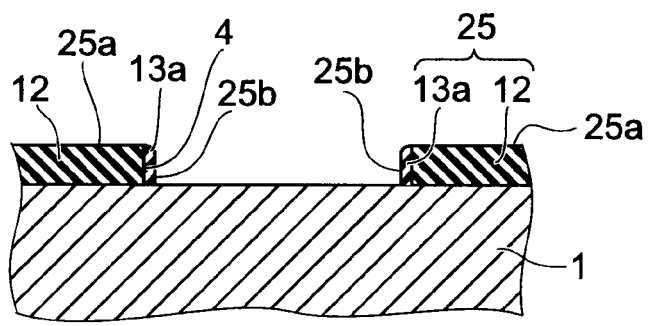

Continuing as illustrated in FIG. 7A, etch-back of the entire surface of the cover film 13 (referring to FIG. 6D) is performed by etching such as reactive ion etching, wet etching, etc. Thereby, the cover film 13 remains only on the side surface of the opening 4, and the cover film 13 that is on the upper surface 1a of the patterning material 1 and on the upper surface of the base film 12 is removed. As a result, a hydrophobic sidewall 13a is formed on the side surface of the opening 4. A guide film 25 is formed of the base film 12 and the sidewall 13a. An upper surface 25a of the guide film 25 is hydrophilic because the hydrophilic base film 12 is exposed; and a side surface 25b of the opening 4 of the guide film 25 is hydrophobic because the hydrophobic sidewall 13a is exposed.

The subsequent processes are similar to those of the first embodiment described above.

Figure 7B:
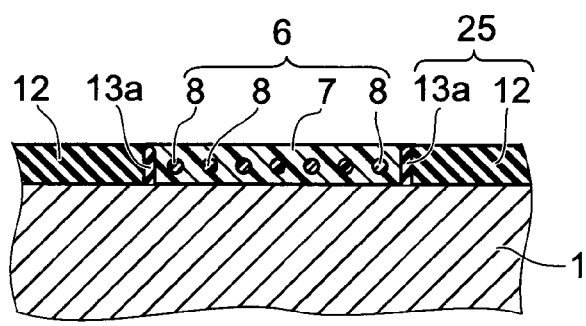

Namely, the solution 6 is coated as illustrated in FIG. 7B. Similarly to the first embodiment described above, the amphiphilic polymer included in the solution 6 is a molecule in which the length of the hydrophobic portion is longer than the length of the hydrophilic portion. Thereby, the solution 6 is filled only into the interior of the opening 4, and the solution 6 is phase-separated into the hydrophilic block 8 having the cylindrical configuration and the hydrophobic block 7 provided around the hydrophilic block 8.

Figure 7C:
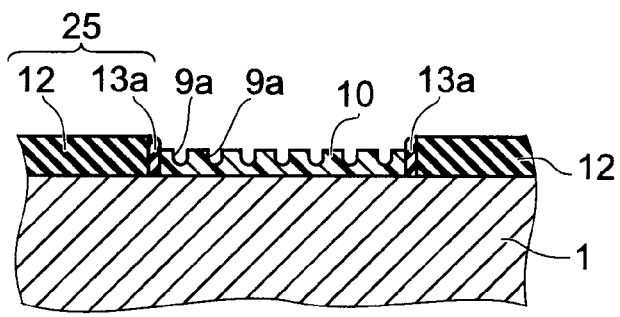

Then, as illustrated in FIG. 7C, after forming the cured film by causing the solution 6 to cure, the mask member 10 is formed by removing the hydrophilic block 8 having the cylindrical configuration.

Figure 7D:
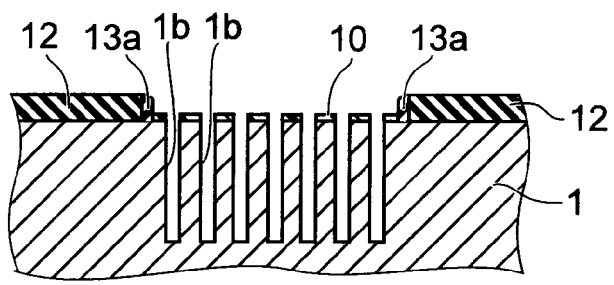

Continuing as illustrated in FIG. 7D, the patterning material 1 is patterned using the mask member 10 as a mask. Thereby, the microstructure is manufactured.

In the embodiment as well, effects similar to those of the first embodiment described above can be obtained. Otherwise, the manufacturing method of the embodiment is similar to that of the first embodiment described above.

In the second and third embodiments described above as well, similarly to the modification of the first embodiment described above, the hydrophobic property and the hydrophilic property may be reversed. In other words, although examples are illustrated in the first to third embodiments described above in which a guide film having a hydrophilic upper surface and a hydrophobic side surface of the opening is formed and an amphiphilic polymer having a hydrophobic block used as the peripheral block is applied to cover the guide film, the basic configuration and effects are similar to those of the first to third embodiments even in the case where a guide film having a hydrophobic upper surface and a hydrophilic side surface of the opening is formed and an amphiphilic polymer having a hydrophilic block used as the peripheral block is applied to cover the guide film.

In the embodiments described above, an amphiphilic polymer that includes a polyacrylate in which a liquid crystal mesogenic group is substituted, polyethylene oxide, polypropylene oxide, polybutylene oxide, and the like may be used as an amphiphilic polymer having high cylindrical orientation.

In the embodiments described above, the components of the peripheral block may contain a silicon-containing component having high oxygen etching resistance to increase the etching selectivity between the cylinder block and the peripheral block. For example, a derivative of silsesquioxane, etc., an organic or inorganic silicon-containing compound such as a silicate, hydrogen siloxane, methyl siloxane, hydrogen silsesquioxane, methylsilsesquioxane, etc., may be contained.

Although examples are illustrated in the embodiments described above in which the cylinder block is removed by etching, this is not limited thereto. For example, heating may be performed to volatilize the components of the cylinder block and discharge the components of the cylinder block out of the cured film by causing the components of the cylinder block to pass between the molecules of the peripheral block.

Although etching is illustrated as the processing performed on the patterning material 1 using the mask member 10 in the embodiments described above, this is not limited thereto. It is sufficient for the processing to use a mask member in which a periodic pattern is formed. For example, an impurity may be ion-implanted into the patterning material 1 using the mask member 10 as a mask. Thereby, an impurity diffusion layer can be selectively formed in the upper layer portion of the patterning material 1.

According to the embodiments described above, a method for manufacturing a microstructure having high form accuracy can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A method for manufacturing a microstructure, comprising:
    forming a guide film on a patterning material, an upper surface of the patterning material being hydrophobic, an opening being made in the guide film, an upper surface of the guide film being hydrophilic, a side surface of the opening being hydrophobic;
    forming a cured film by applying a solution to cover the patterning material and the guide film, separating the solution into a hydrophobic block and a hydrophilic block, and curing the solution, the solution containing an amphiphilic polymer having a hydrophobic portion and a hydrophilic portion, a length of the hydrophobic portion being longer than a length of the hydrophilic portion, the hydrophobic portion being aggregated in the hydrophobic block, the hydrophilic portion being aggregated in the hydrophilic block;
    forming a mask member by removing the hydrophilic block from the cured film; and
    performing processing of the patterning material using the mask member as a mask.

2. The method according to claim 1, wherein the hydrophilic block has a cylindrical configuration extending in a direction parallel to the upper surface of the patterning material, and the hydrophobic block covers the hydrophilic block to contact the upper surface of the patterning material and the side surface of the opening in the cured film.

3. The method according to claim 1, wherein the forming of the guide film includes:
    forming a base film, the base film being hydrophobic;
    forming a cover film on the base film, the cover film being hydrophilic; and
    making the opening in the cover film and the base film.

4. The method according to claim 1, wherein the forming of the guide film includes:
    forming a base film, the base film being hydrophobic;
    causing an upper surface of the base film to be hydrophilic by performing modification treatment of the upper surface of the base film; and
    making the opening in the base film.

5. The method according to claim 1, wherein the forming of the guide film includes:
    forming a base film, the base film being hydrophilic;
    making the opening in the base film;
    forming a cover film on the base film, the cover film being hydrophobic; and
    forming a sidewall on the side surface of the opening by performing etch-back of the cover film, the sidewall being hydrophobic.

6. The method according to claim 1, wherein:
    the hydrophobic portion is polystyrene; and
    the hydrophilic portion is one type of molecule selected from the group consisting of polymethylmethacrylate, poly(ethylene-alt-propylene), polybutadiene, polyisoprene, polyvinyl methyl ether, and polyethylene oxide.

7. A method for manufacturing a microstructure, comprising:
    forming a guide film on a patterning material, an upper surface of the patterning material being hydrophilic an opening being made in the guide film, an upper surface of the guide film being hydrophobic, a side surface of the opening being hydrophilic;
    forming a cured film by applying a solution to cover the patterning material and the guide film, separating the solution into a hydrophilic block and a hydrophobic block, and curing the solution, the solution containing an amphiphilic polymer having a hydrophilic portion and a hydrophobic portion, a length of the hydrophilic portion being longer than a length of the hydrophobic portion, the hydrophilic portion being aggregated in the hydrophilic block, the hydrophobic portion being aggregated in the hydrophobic block;
    forming a mask member by removing the hydrophobic block from the cured film; and
    performing processing of the patterning material using the mask member as a mask.

8. The method according to claim 7, wherein the hydrophobic block has a cylindrical configuration extending in a direction parallel to the upper surface of the patterning material, and the hydrophilic block covers the hydrophobic block to contact the upper surface of the patterning material and the side surface of the opening in the cured film.

9. The method according to claim 7, wherein the forming of the guide film includes:
    forming a base film, the base film being hydrophilic;
    forming a cover film on the base film, the cover film being hydrophobic; and
    making the opening in the cover film and the base film.

10. The method according to claim 7, wherein the forming of the guide film includes:
    forming a base film, the base film being hydrophilic;
    causing an upper surface of the base film to be hydrophobic by performing modification treatment of the upper surface of the base film; and
    making the opening in the base film.

11. The method according to claim 7, wherein the forming of the guide film includes:
    forming a base film, the base film being hydrophobic;
    making the opening in the base film;
    forming a cover film on the base film, the cover film being hydrophilic; and
    forming a sidewall on the side surface of the opening by performing etch-back of the cover film, the sidewall being hydrophilic.

12. The method according to claim 7, wherein:
    the hydrophobic portion is polystyrene; and the hydrophilic portion is one type of molecule selected from the group consisting of polymethylmethacrylate, poly(ethylene-alt-propylene), polybutadiene, polyisoprene, polyvinyl methyl ether, and polyethylene oxide.

13. A method for manufacturing a microstructure, comprising:

forming a base film on a patterning material, the base film being hydrophobic, an upper surface of the patterning material being hydrophobic;

forming a cover film on the base film, the cover film being hydrophilic;

making an opening in the cover film and the base film;

forming a cured film by applying a solution to cover the patterning material, separating the solution into a hydrophilic block and a hydrophobic block, and curing the solution, the solution containing an amphiphilic polymer having a hydrophobic portion and a hydrophilic portion, a length of the hydrophobic portion being longer than a length of the hydrophilic portion, the hydrophilic portion being aggregated in the hydrophilic block, the hydrophobic portion being aggregated in the hydrophobic block, the hydrophilic block having a cylindrical configuration extending in a direction parallel to the upper surface of the patterning material, the hydrophobic block covering the hydrophilic block to contact the upper surface of the patterning material and a side surface of the opening;

forming a mask member by removing the hydrophilic block from the cured film; and performing processing of the patterning material using the mask member as a mask.

* * * * *